US005606297A

United States Patent [19]

Phillips

[11] Patent Number: 5,606,297

[45] Date of Patent: Feb. 25, 1997

[54] CONICAL ULTRASOUND WAVEGUIDE

[75] Inventor: William A. Phillips, Delta, Canada

[73] Assignee: Novax Industries Corporation, New Westminster, Canada

[21] Appl. No.: 586,547

[22] Filed: Jan. 16, 1996

[51] Int. Cl.[6] .................................................. H03H 9/00

[52] U.S. Cl. .......................... 333/141; 333/142; 333/147; 310/334; 381/153; 381/159; 181/182; 181/189

[58] Field of Search .................................... 333/141, 142, 333/143, 145, 147, 208, 239, 242, 248; 310/334; 367/137; 381/153, 154, 156, 159; 181/175, 182–184, 189

[56] References Cited

U.S. PATENT DOCUMENTS

| | | | |
|---|---|---|---|
| 4,077,023 | 2/1978 | Boyd et al. | 333/147 |
| 4,119,934 | 10/1978 | Weglein et al. | 333/143 |
| 4,742,318 | 5/1988 | Jen et al. | 333/141 |
| 4,743,870 | 5/1988 | Jen et al. | 333/141 |
| 5,131,052 | 7/1992 | Hill et al. | 381/159 |
| 5,294,861 | 3/1994 | Nattermann | 333/141 |

FOREIGN PATENT DOCUMENTS

| | | | |
|---|---|---|---|
| 63-92112 | 4/1988 | Japan | 333/143 |

*Primary Examiner*—Benny Lee
*Assistant Examiner*—Darios Gambino
*Attorney, Agent, or Firm*—Oyen Wiggs Green & Mutala

[57] ABSTRACT

A waveguide for projecting a longitudinal acoustic wave of wavelength $\lambda$ from an ultrasound energy source toward a target area. The waveguide has at least one tubular channel. The channel has inwardly tapered, conical inlet and outlet ports separated by a venturi. The inlet port taper defines a sharply rimmed entry orifice around the inlet port. A separation distance equal to one wavelength $\lambda$ is maintained between the source and the waveguide's inlet port. The waveguide shears off a cross-section of the wave emitted by the energy source and ejects it at accelerated velocity toward the target area. The channel has a length L and the venturi has a diameter D, such that the waveguide has an emitted beam angle equal to 2 ($\tan^{-1}$ (D/L)). Preferably, a plurality of tubular channels are aligned concentrically around and longitudinally parallel to the one tubular channel, each channel having a selected length and a selected diameter. The channels are preferably circular in cross-section, with their outlet ports located in an inwardly scalloped front face of the waveguide.

10 Claims, 3 Drawing Sheets

CONICAL ULTRASOUND WAVEGUIDE

FIELD OF THE INVENTION

This application pertains to a waveguide for projecting a beam of ultrasonic energy up to about 80 feet through air for the purpose of detecting targets such as vehicles, pedestrians, or the like moving through a region such as a traffic intersection.

BACKGROUND OF THE INVENTION

Ultrasound detectors are used to detect vehicles, pedestrians, or the like moving through regions such as selected portions of vehicle traffic intersections. By monitoring such movement traffic engineers can gauge changing traffic flow patterns and take appropriate action, such as adjusting the operation of traffic signal lights.

Ultrasonic energy beams projected through air by such prior art devices typically diverge considerably from the ultrasound energy source. Waveguides employed in such prior art devices commonly utilize reflective techniques and tuned assemblies to compensate for such divergence and thereby improve detection accuracy. The present invention, by contrast, shears off a cross-section of the energy pattern emitted by the ultrasound energy source and ejects it at accelerated velocity toward the target area. This enables the invention to minimize divergence by controlling the beam angle of the emitted ultrasonic energy beam.

SUMMARY OF THE INVENTION

In accordance with the preferred embodiment, the invention provides a waveguide for projecting a longitudinal acoustic wave of wavelength λ from an ultrasound energy source toward a target area. The waveguide has at least one tubular channel. The channel has inwardly tapered, conical inlet and outlet ports separated by a venturi. The inlet port taper defines a sharply rimmed entry orifice around the inlet port. A separation distance equal to one wavelength λ is maintained between the source and the waveguide's inlet port. The channel has a length L and the venturi has a diameter D, such that the waveguide has an emitted beam angle equal to 2 ($\tan^{-1}$ (D/L)).

Advantageously, the tubular channel has a cross-sectional shape which imparts no more than about a 72° change in direction to the longitudinal acoustic wave as it passes through the channel.

Preferably, a plurality of tubular channels are aligned concentrically around and longitudinally parallel to the one tubular channel, each channel having a selected length and a selected diameter. The channels are preferably circular in cross-section. The channels' outlet ports are located in an inwardly scalloped front face of the waveguide.

DETAILED DESCRIPTION OF THE PREFERRED EMBODIMENT

Figure 2:
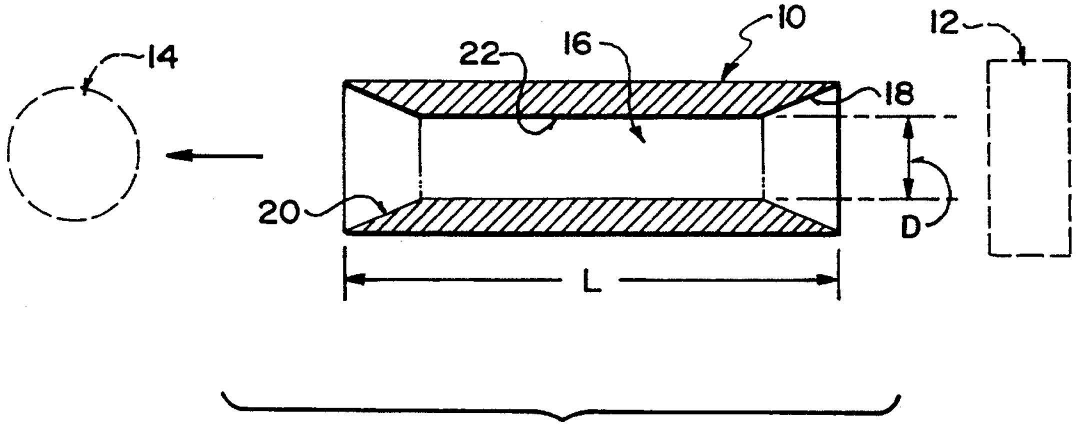
FIG. 2 is a simplified cross-sectional illustration of one of the waveguide apertures of the FIG. 1 waveguide.
Figure 3:
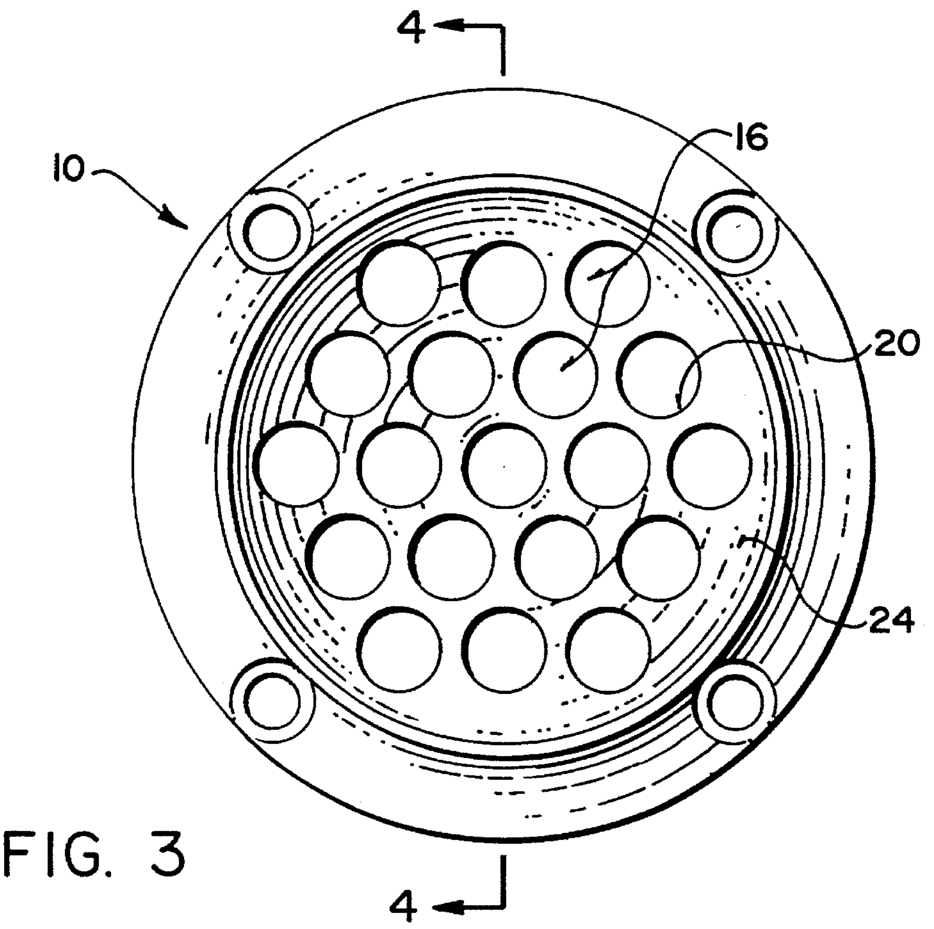
FIG. 3 is a front elevation view of the conical ultrasound waveguide of FIG. 1.
Figure 4:
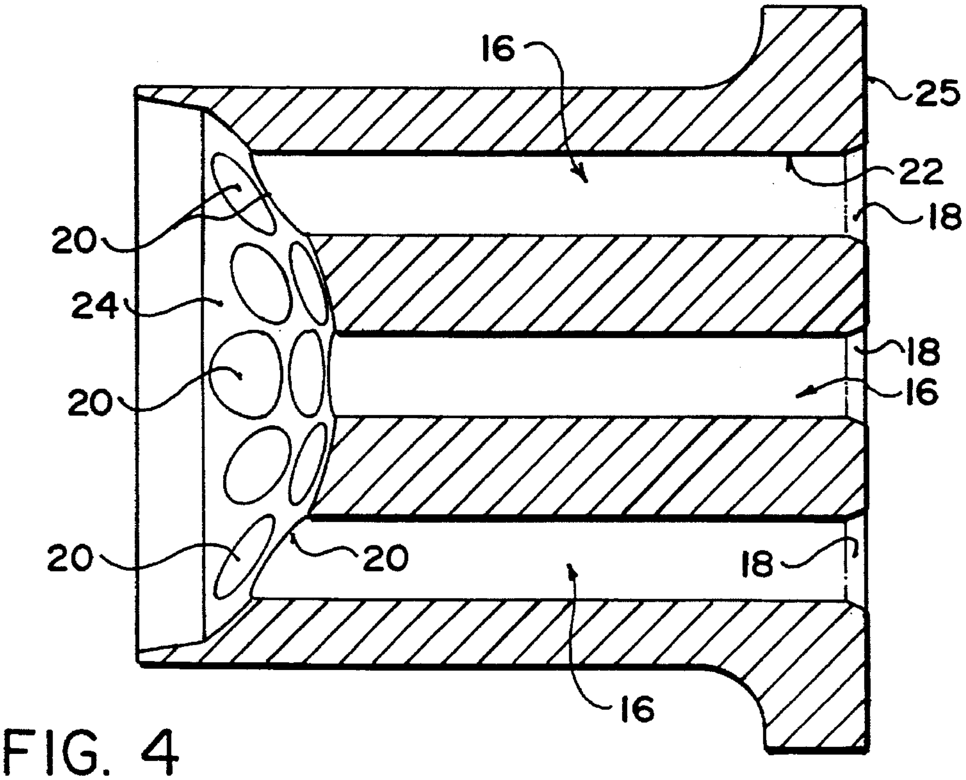
FIG. 4 is a cross-sectional side elevation view taken with respect to line 4—4 of FIG. 3.
Figure 5:
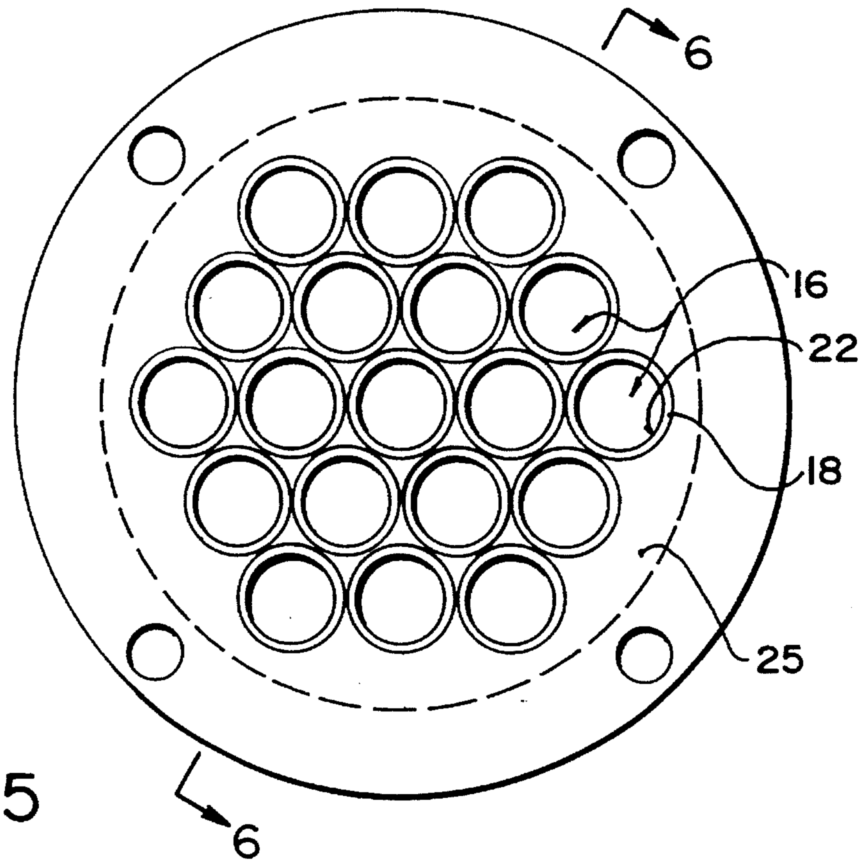
FIG. 5 is a rear elevation view of the conical ultrasound waveguide of FIG. 1.
Figure 6:
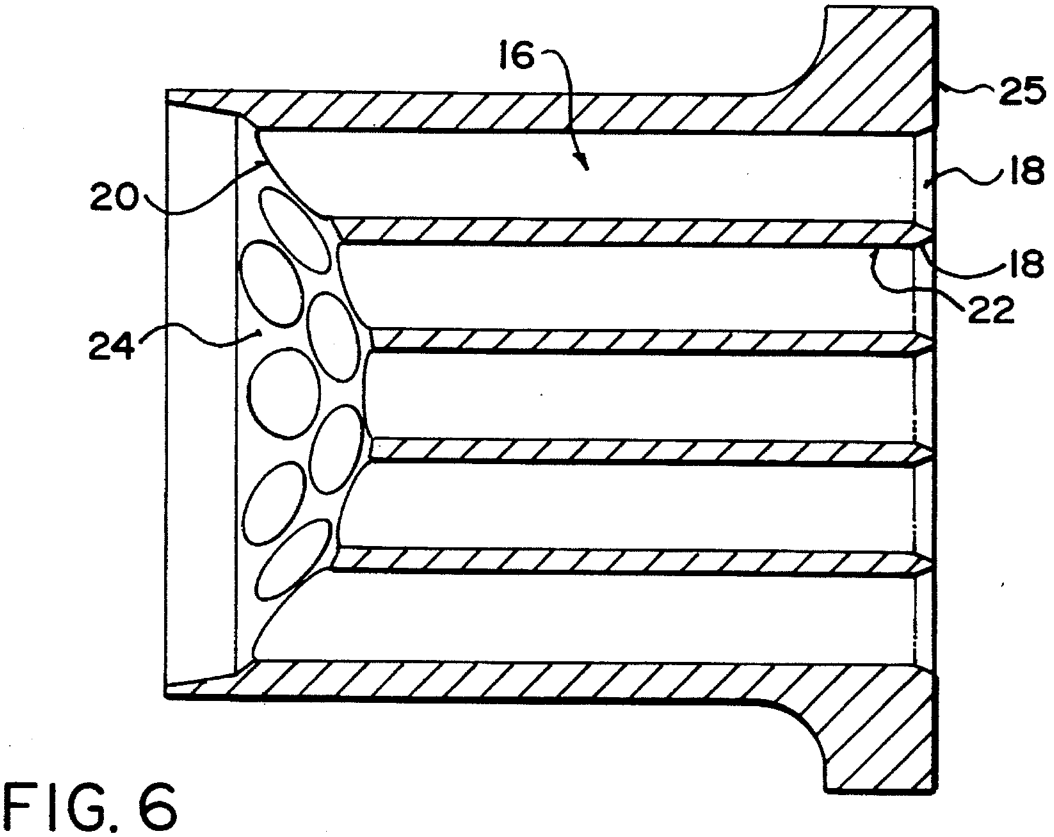
FIG. 6 is a cross-sectional side elevation view taken with respect to line 6—6 of FIG. 5.

As shown in the drawings, the invention provides a conical ultrasound waveguide 10 for projecting an acoustical longitudinal ultrasound wave having a wavelength λ from an ultrasound energy source 12 toward a target area 14. Energy source 12 typically emits ultrasound waves in the 31,500 to 72,000 Hertz frequency range. Waveguide 10 incorporates at least one and preferably a cluster of many tubular channels 16. As seen in FIG. 2, each of channels 16 has inwardly tapered, conical inlet and outlet ports 18, 20 separated by venturi 22.

The wall thickness of each of channels 16 is at least 0.010 inches in the central portion of venturi 22 and reduces to 0.0005 inches at the outer tapered rims of inlet and outlet ports 18, 20. Such tapering defines sharply rimmed entry and exit orifices around inlet and outlet ports 18, 20 respectively. Venturi 22 preferably constitutes at least a 5% reduction in the cross-sectional area of channel 16, at the channel's longitudinal midpoint.

In use, conical waveguide 10 is spaced exactly one (preferably, 1.0±3%) wavelength from ultrasound energy source 12. This, in combination with the sharply rimmed orifices aforesaid, yields the desired shearing of the ultrasound energy wave emitted by source 12, with minimal reflection.

Tubular channels 16 are of arbitrary cross-sectional shape, provided that a gas or pressure wave may pass smoothly through such shape with no more than a 72° change in direction to the longitudinal wave. The gas flow may be either laminar or turbulent. In practice, circular cross-sectioned channels with appropriate tapering are easily fabricated by machining a block of 6061 aluminium on a CNC machine center.

As seen in FIG. 2, the wave emitted by ultrasound energy source 12 propagates toward inlet port 18, which shears the wave to the correct shape. The reduction in cross-sectional area presented by venturi 22 causes a pressure drop over the length of channel 16 which accelerates the sheared wave through channel 16 to outlet port 20. The pressure drop manifests itself as a reduction in source impedance to ultrasound energy source 12, as opposed to the reflected energy loss inherent to prior art waveguides.

The beam angle, namely the angle at which the overall sensitivity of the detector is reduced 3 dB, is given by 2 ($\tan^{-1}$ (D/L)), where D is the diameter of venturi 22 and L is the length of channel 16. This relationship holds true, to a close degree of approximation, for a given waveguide element, due to the shearing action of the waveguide entrance geometry.

Waveguides comprising a cluster or plurality of tubular channels 16 having varying length and diameter can be assembled to achieve more complex beam patterns including post-divergence, convergence and/or collimation of the emitted energy. Non-linear beam shape from the conical waveguide results from phase summation and cancellations at specific distances from the waveguide outlet port(s).

Figure 1:
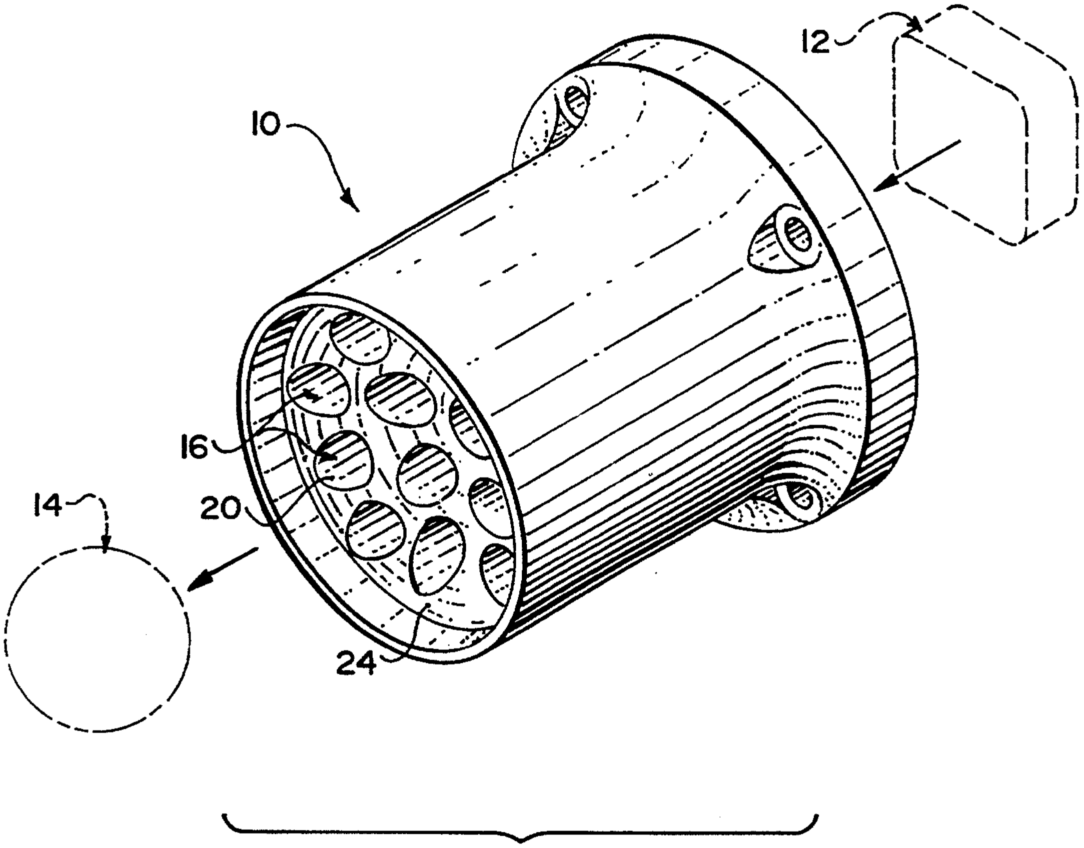
FIG. 1 is a pictorial illustration of a conical ultrasound waveguide constructed in accordance with the invention.

As seen in FIG. 1, the outlet face 24 of waveguide 10 is inwardly scalloped to minimize cancellation of the returned wave (i.e. the wave reflected by target 14). More particularly, if outlet face 24 had a flat, planar shape (like inlet face 25, which contains inlet ports 18) and if a returned wave coincided in phase with a wave being emitted by waveguide 10, then the two waves would cancel one another. Scalloping outlet face 24 as aforesaid staggers outlet ports 20 in different planes relative to the returned wave. An inwardly elliptically curved shape is preferred for outlet face 24.

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

What is claimed is:

1. A waveguide for projecting a longitudinal acoustic wave having a wavelength λ from a source toward a target area, said waveguide comprising at least one tubular channel, said channel having inwardly tapered, conical inlet and outlet ports separated by a venturi.

2. A waveguide as defined in claim 1, wherein said inlet port taper defines a sharply rimmed entry orifice around said inlet port.

3. A waveguide as defined in claim 2, further comprising a separation distance equal to said wavelength λ between said source and said waveguide.

4. A waveguide as defined in claim 2, wherein said tubular channel has a cross-sectional shape which imparts no more than a 72° change in direction to said longitudinal acoustic wave, during passage of said longitudinal acoustic wave through said channel.

5. A waveguide as defined in claim 2, wherein said tubular channel has a length L and said venturi has a diameter D such that said waveguide has an emitted beam angle equal to $2(\tan^{-1}(D/L))$.

6. A waveguide as defined in claim 2, further comprising a plurality of said tubular channels aligned concentrically around and longitudinally parallel to said one tubular channel.

7. A waveguide as defined in claim 6, wherein each of said plurality of tubular channels has a selected length and a selected diameter.

8. A waveguide as defined in claim 6, wherein said tubular channels are circular in cross-section.

9. A waveguide as defined in claim 6, wherein said inlet ports are located in a planar rear face of said waveguide and said outlet ports are located in an inwardly scalloped front face of said waveguide.

10. A waveguide as defined in claim 6, wherein said source is an ultrasound energy source and said longitudinal acoustic wave has a frequency of about 31,500 to 72,000 Hertz.

* * * * *